United States Patent [19]

Okamoto et al.

[11] 4,005,761

[45] Feb. 1, 1977

[54] CAR LOUD SPEAKER

[75] Inventors: Kintaro Okamoto, Hachioji; Hirokatu Kudo, Wako; Etsuro Kadoiri; Hiroshi Soma, both of Tokyo, all of Japan

[73] Assignees: Pioneer Electronic Corporation; Honda Giken Kogyo Kabushiki Kaisha, both of Tokyo, Japan

[22] Filed: Nov. 26, 1975

[21] Appl. No.: 635,545

[30] Foreign Application Priority Data

Nov. 26, 1974 Japan .......................... 49-143245

[52] U.S. Cl. .............................. 181/141; 181/150; 179/1 VE; 248/220.1

[51] Int. Cl.$^2$ ........................................ H05K 10/00

[58] Field of Search ......... 179/1 E, 1 VE; 181/141, 181/148–156; 248/204, 222, 300

[56] References Cited

UNITED STATES PATENTS

| | | | |
|---|---|---|---|
| 1,844,802 | 2/1932 | Seabert | 181/151 X |
| 1,905,215 | 4/1933 | Cadieux | 179/1 VE |
| 1,930,577 | 10/1933 | Atkinson | 181/148 X |
| 2,165,637 | 7/1939 | Little | 179/1 VE |

*Primary Examiner*—Lawrence R. Franklin
*Attorney, Agent, or Firm*—Sughrue, Rothwell, Mion, Zinn & Macpeak

[57] ABSTRACT

A speaker assembly adapted for mounting at the surface of the ceiling of a car. The assembly includes a first stay attached to the speaker and having arms with ends thereof for engaging the side and back ceiling rails of the car when the speaker is positioned in the corner of the ceiling below the ceiling fabric. A corner stay also attached to the speaker has a hook for engaging the ceiling rail at the corner thereof and a biasing spring for biasing the stay and hook against said rail.

4 Claims, 5 Drawing Figures

CAR LOUD SPEAKER

RELATED APPLICATIONS

U.S. applications S.N. 626,005 (corresponding to Japanese Utility Model Applications 49-124055, 49-130150, and 49-130149), entitled "Sound Reproducing Apparatus in the Inside of a Car," and assigned to the present assignees, describes and claims a speaker assembly for easy mounting in the corner of the ceiling of an automobile.

BACKGROUND OF THE INVENTION

This invention relates to a loud speaker and, in particular, a loud speaker designed so as to be mounted to the corner of a ceiling surface in the inside of a car.

Loud speakers for a car radio or a car stereophonic set are well known in the art, and while a speaker for a monophonic car radio can be mounted on the dash board without problems related to the mounting position, speakers for a car stereo set present some mounting problems because two such speakers must be located on the left and the right sides of the car. Conventionally, stereo speakers are mounted behind the rear seats but it is preferred to locate them in an idle space of a car considering the effective use of the restricted space in the car.

SUMMARY OF THE INVENTION

According to the present invention, there is provided a car loud speaker that can easily be mounted in the unused ceiling space of a car without the need for screw spikes or drilling work.

DETAILED DESCRIPTION

Figure 1:
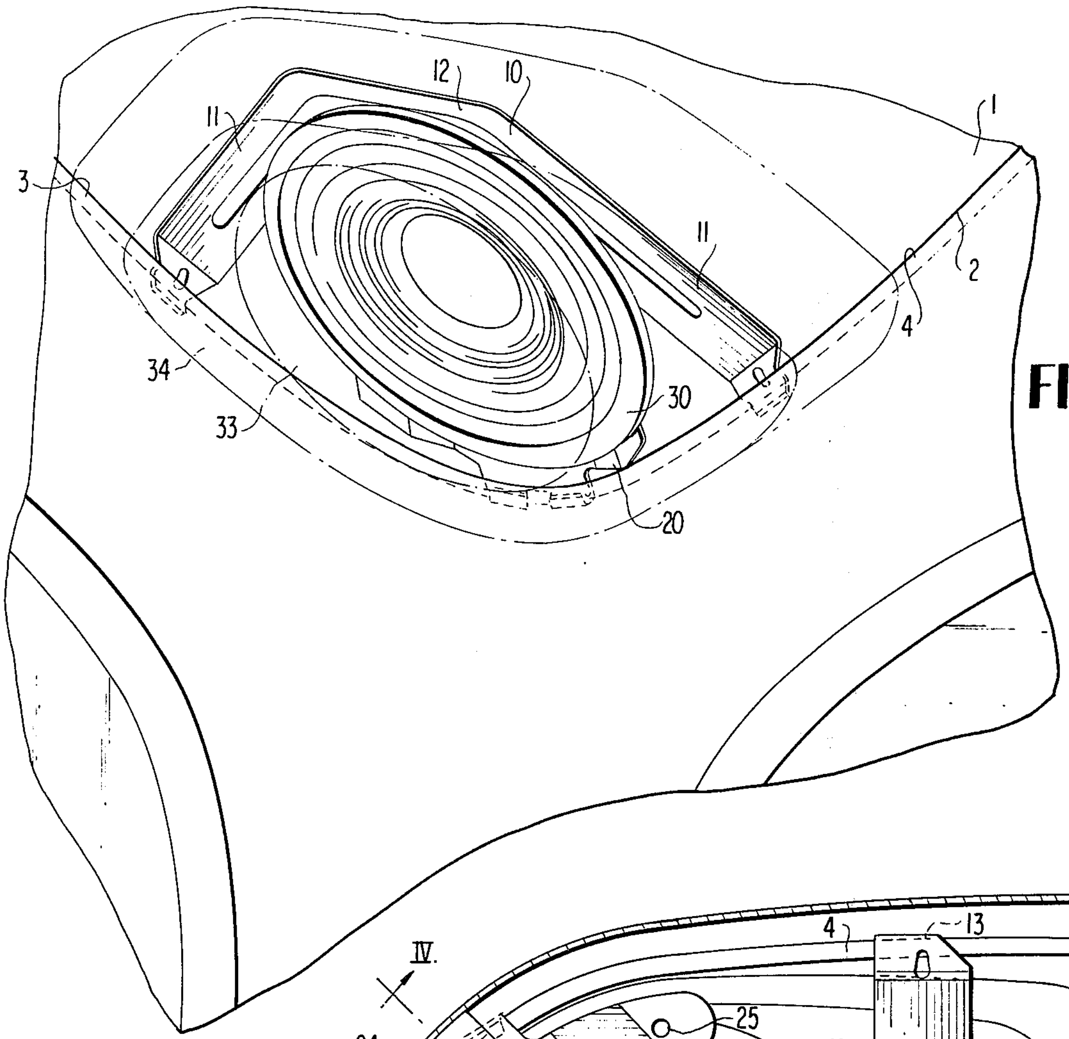
FIG. 1 is a perspective view of a speaker for use with a car according to this invention which is mounted at the back corner of the inside of a car.
Figure 2:
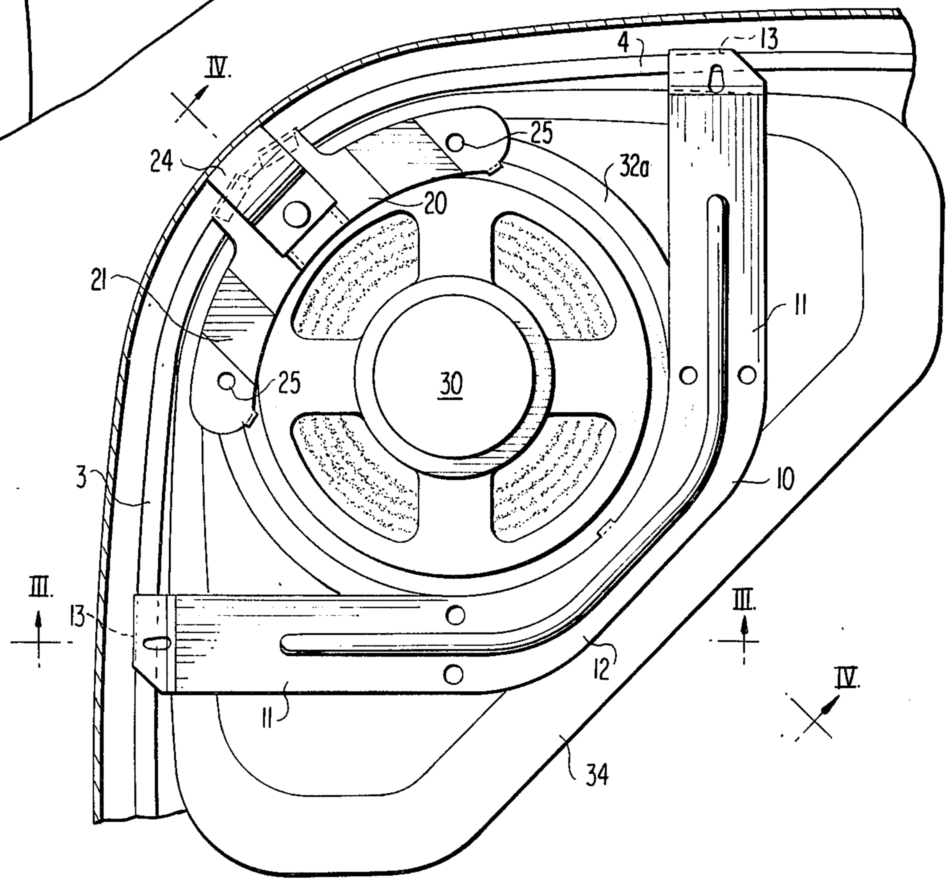
FIG. 2 is a plan view of the speaker viewed from above.
Figure 3:
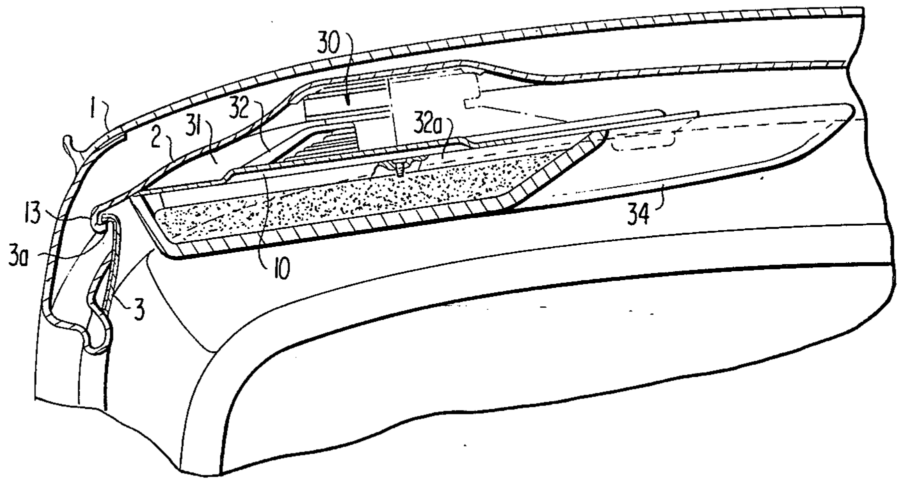
FIG. 3 is a sectional view of the speaker shown in FIG. 2 taken on line III—III.
Figure 4:
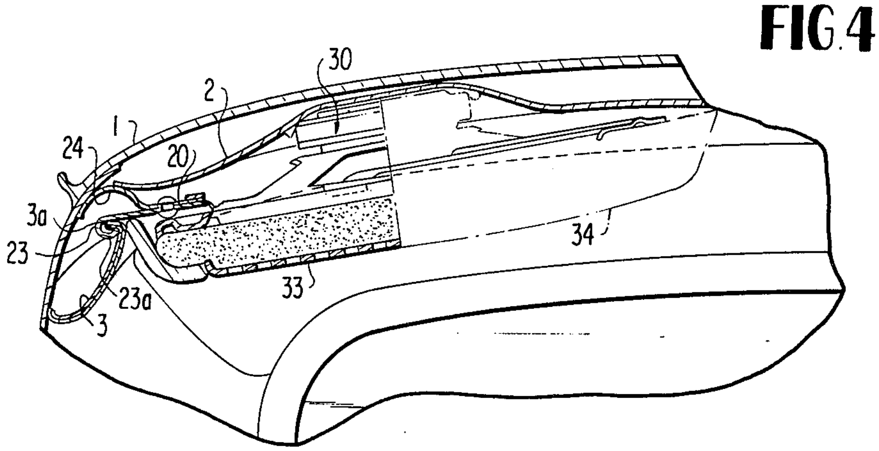
FIG. 4 is a sectional view of the speaker shown in FIG. 2 taken on line IV—IV.
Figure 5:
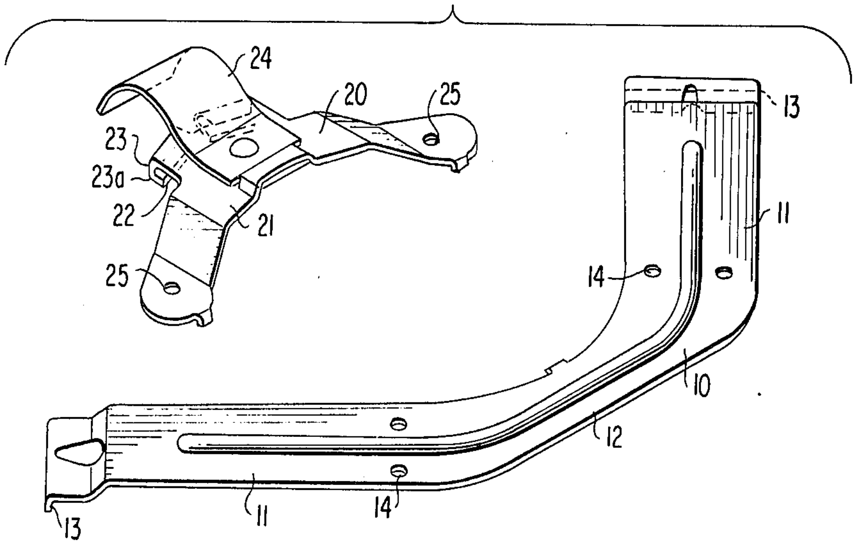
FIG. 5 is a perspective view of a stay and a corner stay.

In the drawings, there is shown a car body having ceiling surface 1 covered with an interior material 2 and provided around the periphery thereof with upwardly opening edges, including, a side rail 3, rear rail 4 and a front rail (not shown). The upper ends of the side rail 3 and the rear rail 4 at a body corner, where they are joined, are bent at their joining portions to form a bent portion 3*a*. The speaker according to this invention is mounted to a car having the structure as described above.

Each speaker is located in a corner of the ceiling and preferably each of two speakers are located at opposite corners in the back of the car. Each speaker is secured to the ceiling by way of stay 10, connected between the side rail 3 and the rear rail 4, and a corner stay 20, located at the corner of the ceiling.

The stay 10 is composed of two arms 11, 11 which project at substantially a right angle relative to each other and a connection member 12 connecting the ends of said two arms 11, 11. The stay 10 is preferably cut from a continuous sheet material. Each of the arms 11, 11 has at its outer end a projection 13 for engaging the side rail 3 and a rear rail 4, respectively, formed by bending the ends of said arms 11, 11. Each arm 11 is slightly bent at the inner side of the projection 13 for facilitating the mounting of the end thereof to the rail. Several threaded holes 14 are provided in the arms 11, 11 in order to fix the speaker as described later.

The corner stay 20 has an edge member 21 of a shape corresponding to that of the periphery of the speaker unit and a pawl 22 that starts from about the center of said edge member 21 and extends laterally to the outside. For engaging the corner of the rail, the pawl 22 has at its end a projection 23, the end of which is bent back to form a hook 23*a*. On the upper surface of the pawl 22, is placed a leaf spring 24 whose base end is fixed to the edge member 21 and which is highest at its middle portion in the shape of a semi-circle. Several threaded holes 25 are also provided in the edge member 21 in order to secure the speaker unit.

The speaker unit 30 comprises a grille 33 and a baffle 34 covering the speaker main body 32 and forms a predetermined space of back chamber 31 between it and the interior material 2 of the ceiling when mounted to the surface of said ceiling. The speaker 32 is fixed by way of its rim 32*a* to the stay 10 and the corner stay 20 by means of spike screws.

Reference is now made to the order of mounting the speaker for use in a car according to this invention. The speaker unit can be mounted to the car quite easily. The speaker unit is assembled to the stay 10 and 20 by bolting the rim 32*a* of the speaker to the stays at 14 and 25 as shown. Then one end of stay 10 is fixed to the ceiling rail, e.g., side rail 3, by engaging projection 13 of arm 11 of stay 10 to the bent portion 3*a* of the rail. Next, the pawl 22 of corner stay 20 is placed on the ceiling rail substantially at the point where the side and back rails, 3 and 4, meet. The stay 20 is engaged to the rail by means of hook 23*a* engaging the bent part 3*a* of the rail. The other end of stay 10 is then engaged via projection 13 to the back rail 3. The leaf spring 24 on stay 20 will press against the ceiling fabric 2 and the ceiling to bias the pawl 22 and hook 23*a* against the ceiling rail and the bent part 3*a* thereof. The speaker unit 30 is thus mounted to the surface of the ceiling of the car whereby the stay 10 is supported between the side rail 3 and the rear rail 4 and the corner stay 20 is fixed to the meeting portion of the rails.

Since the speaker unit 30 mounted to the surface of the ceiling is enclosed at the back thereof by the surface of the ceiling and is enclosed along the periphery thereof by the baffle 33, the acoustic waves do not leak and, therefore, satisfactory acoustic effects can be obtained.

As can be seen from the foregoing, since the stay and the corner stay, fixed along the circumference of the speaker, are placed on the rail in the inside of a car and the ends thereof are engaged to said rails, the speaker can be mounted to the surface of the ceiling by merely placing the corner stay at the corner of the ceiling and placing and engaging one of the ends of the other stay to either the side rail or the rear rail while forcing the corner stay into the corner of the ceiling and then placing and engaging the other end of the stay to the other of the side rail or the rear rail. This enables easy mounting of the speaker without requiring tools such as spike screws and the like.

What is claimed is:

1. A loud speaker assembly or use in a car, said car comprising a car body having a ceiling and having upwardly directed rails adjacent the ceiling at a body corner, said assembly comprising:

a loud speaker, a first stay means having ends respectively secured to said rails on each side of the corner at which said rails are joined, said first stay means having at both ends thereof fitting means for engaging said rails, and corner stay means having fitting means for engaging said rails at the corner where said rails are joined, and a spring means for pressing against the ceiling of said car at said corner to bias said fitting means against said rail corner from a point line above said rails, and means for attaching said loud speaker to said first and corner stay means.

2. A loud speaker assembly as claimed in claim 1, wherein said rails include a bent part and said corner stay means comprises a first curved portion attached to said speaker, a hook portion extending radially outwardly from said curved portion away from said speaker for engaging the bent part of the upwardly directed rails of said car, and wherein said spring means comprises a leaf spring fixed at one end to said curved portion and extending upwardly and outwardly therefrom and terminating in a free opposite end, said opposite end being lower than a middle part of said leaf spring to form thereby a humped portion to permit pressing against the corner of the ceiling of said car when said hook is engaged.

3. A loud speaker assembly as claimed in claim 2 wherein said loud speaker includes a circular rim, and said first and corner stay means are attached to said loud speaker at said rim.

4. A loud speaker assembly as claimed in claim 2 wherein said first stay means has a pair of arms which are substantially at right angles to one another, and an intermediate portion bridging said pair of arms.

* * * * *